United States Patent
Matano

(10) Patent No.: US 8,299,847 B2
(45) Date of Patent: Oct. 30, 2012

(54) SEMICONDUCTOR DEVICE AND DATA PROCESSING SYSTEM INCLUDING THE SAME

(75) Inventor: Tatsuya Matano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 114 days.

(21) Appl. No.: 12/986,663

(22) Filed: Jan. 7, 2011

(65) Prior Publication Data

US 2011/0175673 A1    Jul. 21, 2011

(30) Foreign Application Priority Data

Jan. 15, 2010 (JP) .................... 2010-007501

(51) Int. Cl.
*G05F 1/10* (2006.01)

(52) U.S. Cl. ....................... 327/544; 327/534

(58) Field of Classification Search .................. 327/534, 327/535, 537, 540, 541, 544
See application file for complete search history.

(56) References Cited

U.S. PATENT DOCUMENTS

| | | | | |
|---|---|---|---|---|
| 6,333,571 B1 * | 12/2001 | Teraoka et al. | ............... | 307/125 |
| 6,373,321 B1 * | 4/2002 | Yamauchi et al. | ............ | 327/534 |
| 7,123,076 B2 * | 10/2006 | Hatakeyama et al. | ........ | 327/534 |
| 7,486,107 B1 * | 2/2009 | Bose et al. | ........................ | 326/33 |
| 7,675,347 B2 * | 3/2010 | Teramoto et al. | ............. | 327/534 |
| 7,839,205 B2 * | 11/2010 | Hirobe | .......................... | 327/540 |

FOREIGN PATENT DOCUMENTS

| JP | 8-227580 | 9/1996 |
|---|---|---|
| JP | 2000-82950 | 3/2000 |

* cited by examiner

*Primary Examiner* — Jeffrey Zweizig
(74) *Attorney, Agent, or Firm* — Morrison & Foerster LLP

(57) ABSTRACT

A pair of power nodes of a logic circuit that needs to output a high level at the time of standby is connected to third and fifth dummy power lines and a pair of power nodes of a logic circuit that needs to output a low level at the time of standby are connected to second and sixth dummy power lines. Fourth, third, sixth, and fifth potentials of the second, third, fifth, and sixth dummy power lines satisfy fourth potential<third potential<first potential, and sixth potential>fifth potential>second potential. With this configuration, a leakage current flowing between a substrate and a gate of a transistor that becomes on at the time of standby, and a leakage current flowing between the substrate and a drain of a transistor that becomes off at the time of standby can be reduced.

22 Claims, 8 Drawing Sheets

SEMICONDUCTOR DEVICE AND DATA PROCESSING SYSTEM INCLUDING THE SAME

BACKGROUND OF THE INVENTION

1. Field of the Invention

The present invention relates to a semiconductor device and a data processing system including the same, and more particularly relates to a semiconductor device capable of reducing its power consumption in the standby state and a data processing system including the semiconductor device.

2. Description of Related Art

In recent years, an operation voltage of semiconductor devices is steadily reduced for reducing their power consumption. Some of currently available semiconductor devices have an operation voltage as low as 1 V. However, a threshold voltage of a transistor needs to be reduced following the reduction in the operation voltage, and this fact leads to a problem that a subthreshold current of the transistor in a non-conductive state is increased. As a solution to this problem, a power gating control method in which power lines are separated into main power lines and dummy power lines has been proposed in Japanese Patent Application Laid-open Nos. 2000-82950 and H08-227580.

Japanese Patent Application Laid-open Nos. 2000-82950 and H08-227580 disclose a technique in which a power node on a high side is connected to a main power line and a power node on a low side is connected to a dummy power line for a logic circuit that needs to output a high level at the time of standby, and a power node on a high side is connected to a dummy power line and a power node on a low side is connected to a main power line for a logic circuit that needs to output a low level at the time of standby. According to this technique, because a source of a transistor that is turned off in a standby mode is invariably connected to a dummy power line, by reducing an electric potential of a dummy power line on a high side at the time of standby and increasing an electric potential of a dummy power line on a low side, a subthreshold current of the transistor that is turned off can be reduced.

However, in the semiconductor devices disclosed in Japanese Patent Application Laid-open Nos. 2000-82950 and H08-227580, a source potential of a transistor that is turned on in the standby mode is the same as a source potential of the transistor in an active mode. Therefore, a leakage current that flows between agate electrode of the transistor that is turned on in the standby mode and a substrate (a back gate) cannot be reduced. Also, a leakage current that flows between a drain of a transistor that is turned off in the standby mode and a substrate (a back gate) cannot be reduced sufficiently.

SUMMARY

In one embodiment, there is provided a semiconductor device comprising: first and fourth power lines that are not power gated; second, third, fifth and sixth power lines that are power gated; a first logic circuit having an input node to receive an input signal and an output node to output an output signal, one power node on a high potential side and other power node on a low potential side, the one power node of the first logic circuit being connected to the third power line, and the other power node of the first logic circuit being connected to the fifth power line; a second logic circuit having an input node to receive an input signal and an output node to output an output signal, one power node on an high potential side and other power node on a low potential side, the one power node of the second logic circuit being connected to the second power line, and the other power node of the second logic circuit being connected to the sixth power line; and a control circuit that performs power gating control over the second, third, fifth and sixth power lines, respectively, wherein the control circuit controls, in a first state, an electric potential of the second and third power lines to a first potential of the first power line and controls an electric potential of the fifth and sixth power lines to a second potential of the fourth power line, the control circuit further controls, in a second state, an electric potential of the third power line to a third potential lower than the first potential, an electric potential of the second power line to a fourth potential lower than the third potential, an electric potential of the sixth power line to a fifth potential higher than the second potential, and an electric potential of the fifth power line to a sixth potential higher than the fifth potential, the first logic circuit outputs a signal having the third potential from the output node thereof in the second state, and the second logic circuit outputs a signal having the fifth potential from the output node thereof in the second state.

In another embodiment, there is provided a semiconductor device comprising: first to third power lines respectively supplied with electric potentials showing a first logical level; a fourth power line supplied with an electric potential showing a second logical level; a first off-leakage control circuit that supplies the second power line with an electric potential that is same as the first potential of the first power line by electrically connecting the second power line to the first power line in a first state, and electrically disconnects the second power line from the first power line in a second state; a second off-leakage control circuit that supplies the third power line with an electric potential that is same as the first potential in the first state, and supplies the third power line with a third potential shifted from the first potential toward a second potential lower than the first potential of the fourth power line in the second state; and a circuit block including a plurality of logic circuits each having an output node, wherein the circuit block includes first logic circuits which a signal output from the output node thereof in the second state is fixed to the first logical level, each of the first logic circuits includes one power node connected to the third power line and other power node supplied with the second potential at least in the first state, and the circuit block includes second logic circuits which a signal output from the output node thereof in the second state is fixed to the second logical level, each of the second logic circuits includes one power node connected to the second power line and other power node supplied with the second potential at least in the first state.

In still another embodiment, there is provided a semiconductor device comprising: a first logic circuit having a first output node and including a first transistor of a first conductivity type that becomes electrically conductive when an output signal to be output from the first output node to a high level and a second transistor of a second conductivity type that becomes electrically conductive when the output signal to be output from the first output node to a low level; and a second logic circuit having a second output node and including a third transistor of the first conductivity type that becomes electrically conductive when an output signal to be output from the second output node to a high level and a fourth transistor of the second conductivity type that becomes electrically conductive when the output signal to be output from the second output node to a low level, wherein in a first state an electric potential of drains of the first to fourth transistors that is in an electrical conductive state becomes a first potential when an output signal of a corresponding logic circuit is at a high level and becomes a second potential when an output signal of a corresponding logic circuit is at a low level, in a second state an electric potential of a drain of the first transistor becomes a third potential shifted from the first potential toward the second potential, a voltage between a source and a drain of the second transistor becomes smaller than a difference potential between the third potential and the second potential, an electric potential of a drain of the fourth transistor becomes a fifth potential shifted from the second potential toward the first potential, a voltage between a source and a drain of the third transistor becomes smaller than a difference potential between the first potential and the fifth potential, and absolute potentials are higher in order of the first potential, the third potential, the fifth potential, and the second potential.

In one embodiment, there is provided a data processing system that includes: the semiconductor device; and a controller that supplies a command to the semiconductor device, wherein the semiconductor device enters in the first state or the second state based on the command.

According to the present invention, a leakage current that flows between a gate electrode of a transistor that becomes electrically conductive in the standby mode and a substrate (a back gate) can be reduced, and a leakage current that flows between a drain of a transistor that becomes electrically non-conductive in the standby mode and a substrate (a back gate) can as well be reduced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Figure 1:
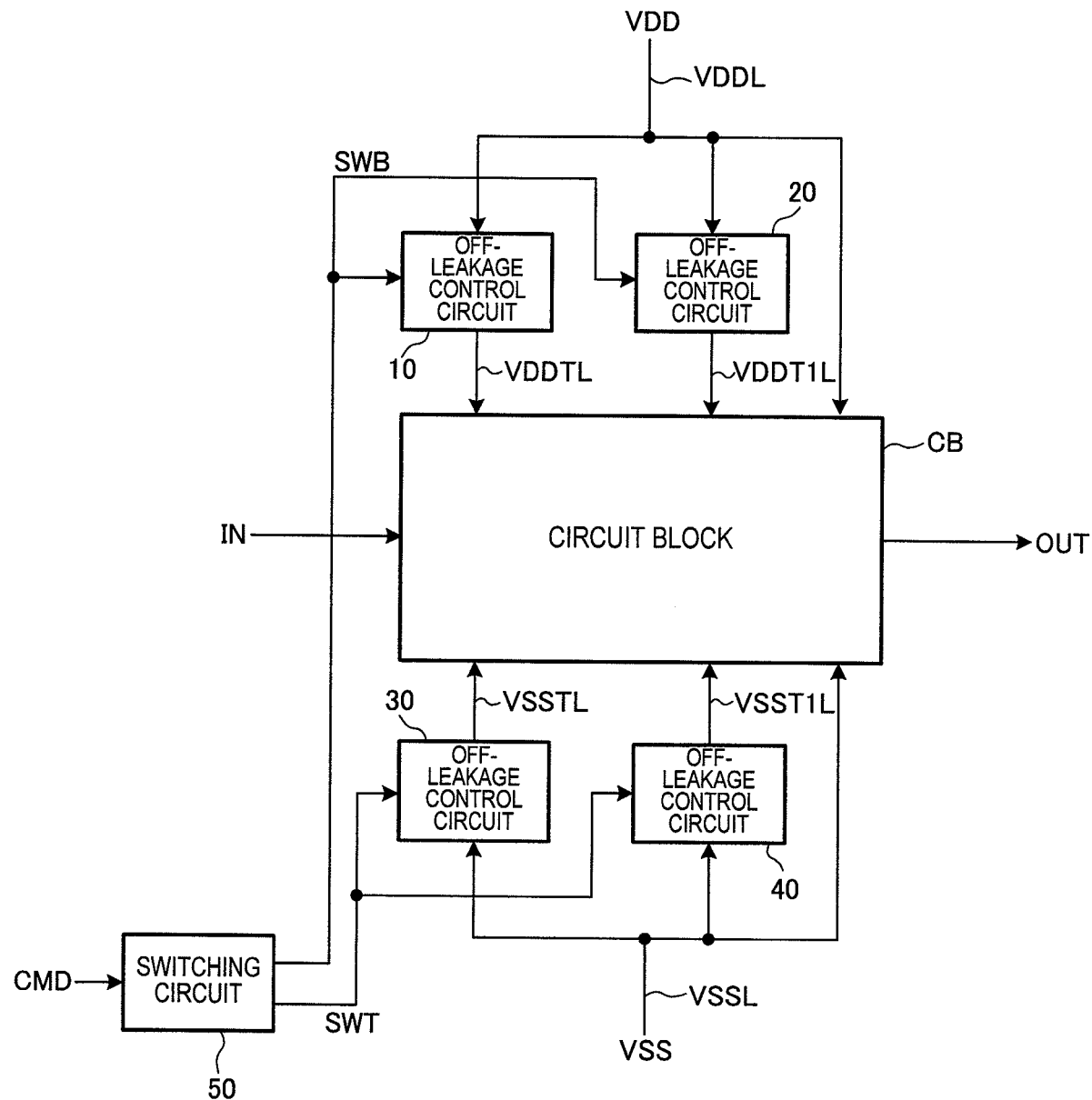
FIG. 1 is a block diagram of a configuration of a semiconductor device according to an embodiment of the present invention.

A representative example of a technical concept for solving the problem of the present invention is described below. It is needless to mention that the contents that the present application is to claim for patent are not limited to the following technical concept, but to the description of the appended claims. That is, the present invention includes, at the time of standby, first and second high-side dummy power lines on a high potential side that are power gated to mutually different electric potentials, first and second low-side dummy power lines on a low potential side that are power gated to mutually different electric potentials, a first logic circuit that is connected to one of the first and second high-side dummy power lines and other of the first and second low-side dummy power lines, a second logic circuit that is connected to other of the first and second high-side dummy power lines and one of the first and second low-side dummy power lines, and a control circuit that controls the first and second high-side dummy power lines and the first and second low-side dummy power lines. All these dummy power lines are power gated by the control circuit at the time of standby, the first and second high-side dummy power lines are controlled to have the same electric potential, and the first and second low-side dummy power lines are controlled to have the same electric potential at the time of being active. In other words, the technical concept of the present invention is to connect the power node on the high side to the first high-side dummy power line and the power node on the low side to the second low-side dummy power line for a logic circuit that needs to output a high level at the time of standby, and to connect the power node on the high side to the second high-side dummy power line and the power node on the low side to the first low-side dummy power line for a logic circuit that needs to output a low level at the time of standby. The first high-side dummy power line is a power line to which an electric potential that is the same as that of a high-side main power line is supplied at the time of being active and an electric potential that is lower than the electric potential of the high-side main power line is supplied at the time of standby. Furthermore, the second high-side dummy power line is a power line to which an electric potential that is the same as that of the high-side main power line is supplied at the time of being active and an electric potential that is further lower than the electric potential of the first high-side dummy power line is supplied at the time of standby. Similarly, the first low-side dummy power line is a power line to which an electric potential that is the same as that of a low-side main power line is supplied at the time of being active and an electric potential that is higher than the electric potential of the low-side main power line is supplied at the time of standby. Furthermore, the second low-side dummy power line is a power line to which an electric potential that is the same as that of the low-side main power line is supplied at the time of being active and an electric potential that is further higher than the electric potential of the first low-side dummy power line is supplied at the time of standby. Consequently, not only that a subthreshold leak (Isub or Ivt) of a transistor that becomes electrically non-conductive at the time of standby is reduced, but also a leakage current (Igate) that flows between a gate electrode of a transistor that becomes electrically conductive at the time of standby and a substrate (a back gate) can be reduced, and a leakage current (Igidl) that flows between a drain of a transistor that becomes electrically non-conductive at the time of standby and a substrate (a back gate) can as well be reduced. The Isub, Igate, and Igidl mean a sub-threshold current, a Gate Leakage current, and Gate Induced Drain Leakage current, respectively.

Preferred embodiments of the present invention will be explained below in detail with reference to the accompanying drawings.

FIG. 1 is a block diagram of a configuration of a semiconductor device according to an embodiment of the present invention.

As shown in FIG. 1, a semiconductor device 100 according to the present embodiment includes a circuit block CB that receives a signal IN and outputs a signal OUT. The circuit block CB is a circuit block that is subjected to a power gating control. The power gating control is control in which subthreshold currents (Isub), Igate, and Igidl are reduced while maintaining a logical state by transmitting a signal having a desired amplitude by setting an operation voltage of the circuit block CB to a value that is the same as a voltage between main power lines in an active mode (first state) where the signal IN can change (dynamic) and by setting the power voltage of the circuit block CB to a value that is lower than the voltage between the main power lines in a standby mode (second state) where the signal IN is fixed (static). Dynamic here means an electric operation such as an operation of switching logic levels between High and Low. Static (or fixed) also means an electric operation, not a permanent physical state, but an operation of maintaining, for example, any one of a High state and a Low state. These technical definitions apply throughout the present specification.

As shown in FIG. 1, the semiconductor device 100 according to the present embodiment includes first to fourth off-leakage control circuits 10, 20, 30, and 40. The off-leakage control circuit 10 is a circuit that receives a power potential VDD (first potential) supplied from a main power line VDDL (first power line) and outputs the power potential VDD or a power potential VDDT (fourth potential) to a dummy power line VDDTL (second power line). The off-leakage control circuit 20 is a circuit that receives the power potential VDD supplied from the main power line VDDL and outputs the power potential VDD or a power potential VDDT1 (third potential) to a dummy power line VDDT1L (third power line). Either of the power potentials VDD, VDDT, and VDDT1 is a logical high level electric potential. As an example, VDD=1.2 Volts (V), VDDT1=1.1 V, and VDDT=1.0 V. That is, these potentials have the following relationship: VDD>VDDT1>VDDT.

The off-leakage control circuit 30 is a circuit that receives a power potential VSS (second potential) supplied from a main power line VSSL (fourth power line) and outputs the power potential VSS or a power potential VSST (sixth potential) to a dummy power line VSSTL (fifth power line). The off-leakage control circuit 40 is a circuit that receives the power potential VSS supplied from the main power line VSSL and outputs the power potential VSS or a power potential VSST1 (fifth potential) to a dummy power line VSST1L (sixth power line). Either of the power potentials VSS, VSST, and VSST1 is a logical low level electric potential. As an example, VSS=0 V, VSST1=0.1 V, and VSST=0.2 V. That is, these potentials have the following relationship: VSS<VSST1<VSST.

Either of the dummy power lines VDDTL, VDDT1L, VSSTL, and VSST1L is connected to the circuit block CB. The circuit block CB performs a switching operation by using the electric potentials supplied via these VDDTL, VDDT1L, VSSTL, and VSST1L as operation potentials. To the circuit block CB are connected the main power lines VDDL and VSSL. Either of the power potential VDD supplied to the circuit block CB via the main power line VDDL and the power potential VSS supplied to the circuit block CB via the main power line VSSL is, as explained later, used as a substrate (a back gate) potential for transistors included in the circuit block CB.

The off-leakage control circuits 10 and 20 are circuits that are controlled by a switching signal SWB supplied from a switching circuit 50, and the off-leakage control circuits 30 and 40 are circuits that are controlled by a switching signal SWT supplied from the switching circuit 50. The switching signals SWB and SWT are complementary signals. When a command signal CMD supplied to the semiconductor device 100 from outside shows an active mode, the switching circuit 50 outputs a low level switching signal SWB and a high level switching signal SWT. Consequently, the off-leakage control circuits 10, 20, 30, and 40 are activated. When the off-leakage control circuits 10, 20, 30, and 40 are active, the off-leakage control circuits 10 and 20 set an electric potential to be supplied to the dummy power lines VDDTL and VDDT1L to VDD (1.2 V), and the off-leakage control circuits 30 and 40 set an electric potential to be supplied to the dummy power lines VSSTL and VSST1L to VSS (0 V).

On the other hand, when the command signal CMD shows a standby mode, the switching circuit 50 outputs a high level switching signal SWB and a low level switching signal SWT. Consequently, the off-leakage control circuits 10, 20, 30, and 40 are inactivated. When the off-leakage control circuits 10, 20, 30, and 40 are inactive, the off-leakage control circuit 10 sets an electric potential to be supplied to the dummy power line VDDTL to VDDT (1.0 V), the off-leakage control circuit 20 sets an electric potential to be supplied to the dummy power line VDDT1L to VDDT1 (1.1 V), the off-leakage control circuit 30 sets an electric potential to be supplied to the dummy power line VSSTL to VSST (0.2 V), and the off-leakage control circuit 40 sets an electric potential to be supplied to the dummy power line VSST1L to VSST1 (0.1 V).

FIGS. 2A to 2D are circuit diagrams of the off-leakage control circuits 10, 20, 30, and 40, respectively.

Figure 2A:
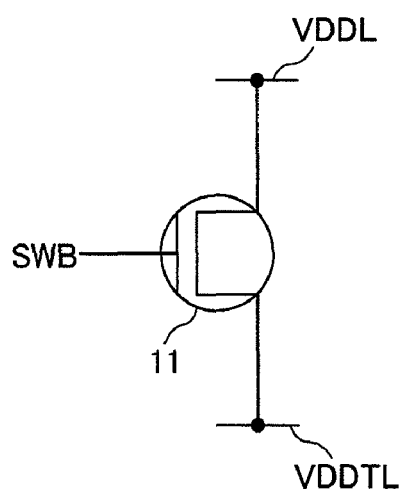
FIGS. 2A to 2D are circuit diagrams of off-leakage control circuit 10, 20, 30, and 40, respectively.

As shown in FIG. 2A, the off-leakage control circuit includes a P-channel MOS transistor 11 (first switch circuit) connected between the main power line VDDL and the dummy power line VDDTL. The switching signal SWB is supplied to a gate electrode of the transistor 11. Consequently, when the switching signal SWB is activated to a low level, the main power line VDDL and the dummy power line VDDTL are short-circuited by the transistor 11. As a result, the electric potential VDD of the main power line VDDL is applied to the dummy power line VDDTL. On the other hand, when the switching signal SWB is inactivated to a high level, because the transistor 11 becomes electrically non-conductive, the dummy power line VDDTL is disconnected from the main power line VDDL. As a result, although, the dummy power line VDDTL enters into a floating state, because the transistor 11 is a transistor with a high drive current output power and its subthreshold leak is also large to a certain extent, the electric potential of the dummy power line VDDTL becomes the above-mentioned electric potential VDDT due to a subthreshold current.

Figure 2B:
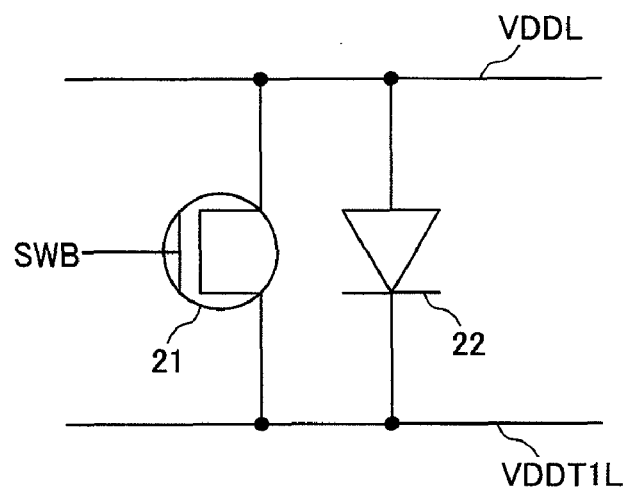

As shown in FIG. 2B, the off-leakage control circuit 20 includes a P-channel MOS transistor 21 (second switch circuit) and a diode 22 (step-down circuit) that are parallel connected between the main power line VDDL and the dummy power line VDDT1L. The switching signal SWB is supplied to a gate electrode of the transistor 21. Consequently, when the switching signal SWB is activated to a low level, the main power line VDDL and the dummy power line VDDT1L are short-circuited by the transistor 21. As a result, the electric potential VDD of the main power line VDDL is applied to the dummy power line VDDT1L. On the other hand, when the switching signal SWB is inactivated to a high level, because the transistor 21 becomes electrically non-conductive, the main power line VDDL and the dummy power line VDDT1L are connected through the diode 22. An anode of the diode 22 is connected to the main power line VDDL and a cathode is connected to the dummy power line VDDT1L. Therefore, when the transistor 21 is turned off, the power potential VDDT1 equivalent to the power potential VDD minus a threshold voltage of the diode 22 is supplied to the dummy power line VDDT1L. That is, assuming the threshold voltage of the diode 22 to be Vt, VDDT1=VDD−Vt.

Figure 2C:
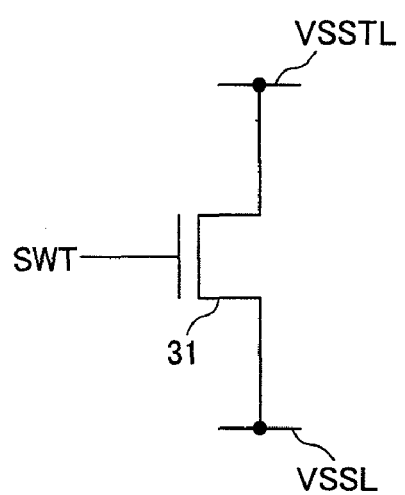

As shown in FIG. 2C, the off-leakage control circuit 30 includes an N-channel MOS transistor 31 connected between the main power line VSSL and the dummy power line VSSTL. The switching signal SWT is supplied to a gate electrode of the transistor 31. Consequently, when the switching signal SWT is activated to a high level, the main power line VSSL and the dummy power line VSSTL are short-circuited by the transistor 31. As a result, the electric potential VSS of the main power line VSSL is applied to the dummy power line VSSTL. On the other hand, when the switching signal SWT is inactivated to a low level, because the transistor 31 becomes electrically non-conductive, the dummy power line VSSTL is disconnected from the main power line VSSL. As a result, although, the dummy power line VSSTL enters into a floating state, because the transistor 31 is a transistor with a high drive current output power and its subthreshold leak is also large to a certain extent, the electric potential of the dummy power line VSSTL becomes the above-mentioned electric potential VSST due to a subthreshold current.

Figure 2D:
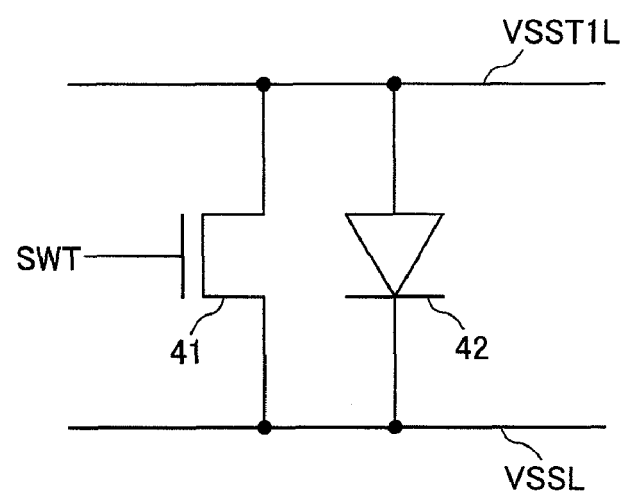

As shown in FIG. 2D, the off-leakage control circuit 40 includes an N-channel MOS transistor 41 and a diode 42 that are parallel connected between the main power line VSSL and the dummy power line VSST1L. The switching signal SWT is supplied to a gate electrode of the transistor 41. Consequently, when the switching signal SWT is activated to a high level, the main power line VSSL and the dummy power line VSST1L are short-circuited by the transistor 41. As a result, the electric potential VSS of the main power line VSSL is applied to the dummy power line VSST1L. On the other hand, when the switching signal SWT is inactivated to a low level, because the transistor 41 becomes electrically non-conductive, the main power line VSSL and the dummy power line VSST1L are connected through the diode 42. An anode of the diode 42 is connected to the dummy power line VSST1L and a cathode is connected to the main power line VSSL. Therefore, when the transistor 41 is turned off, the power potential VSST1 equivalent to the power potential VSS plus a threshold voltage of the diode 42 is supplied to the dummy power line VSST1L. That is, assuming the threshold voltage of the diode 42 to be Vt, VSST1=VSS+Vt.

Figure 3:
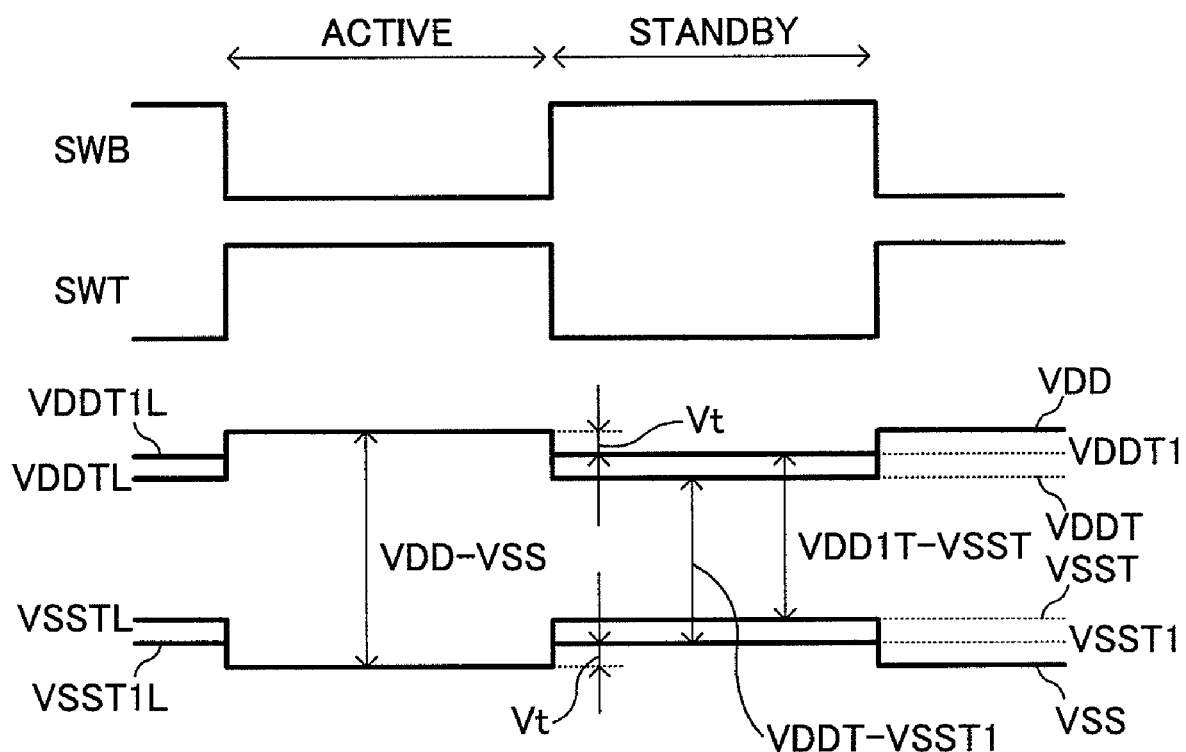
FIG. 3 is a timing chart showing an operation of the off-leakage control circuits 10, 20, 30, and 40.

FIG. 3 is a timing diagram showing an operation of the off-leakage control circuits 10, 20, 30, and 40.

As shown in FIG. 3, because the switching signals SWB and SWT are at a low level and a high level, respectively, in the active mode, the electric potentials of the dummy power lines VDDTL and VDDT1L become the power potential VDD, and the electric potentials of the dummy power lines VSSTL and VSST1L become the power potential VSS. On the other hand, because the switching signals SWB and SWT are at a high level and at a low level, respectively, in the standby mode, the electric potentials of the dummy power lines VDDTL and VDDT1L drop to the power potentials VDDT and VDDT1, respectively, and the electric potentials of the dummy power lines VSSTL and VSST1L rise to the power potentials VSST and VSST1, respectively. At the time of standby, the relation between these electric potentials is as follows: VDDT1>VDDT and VSST1<VSST.

Figure 4:
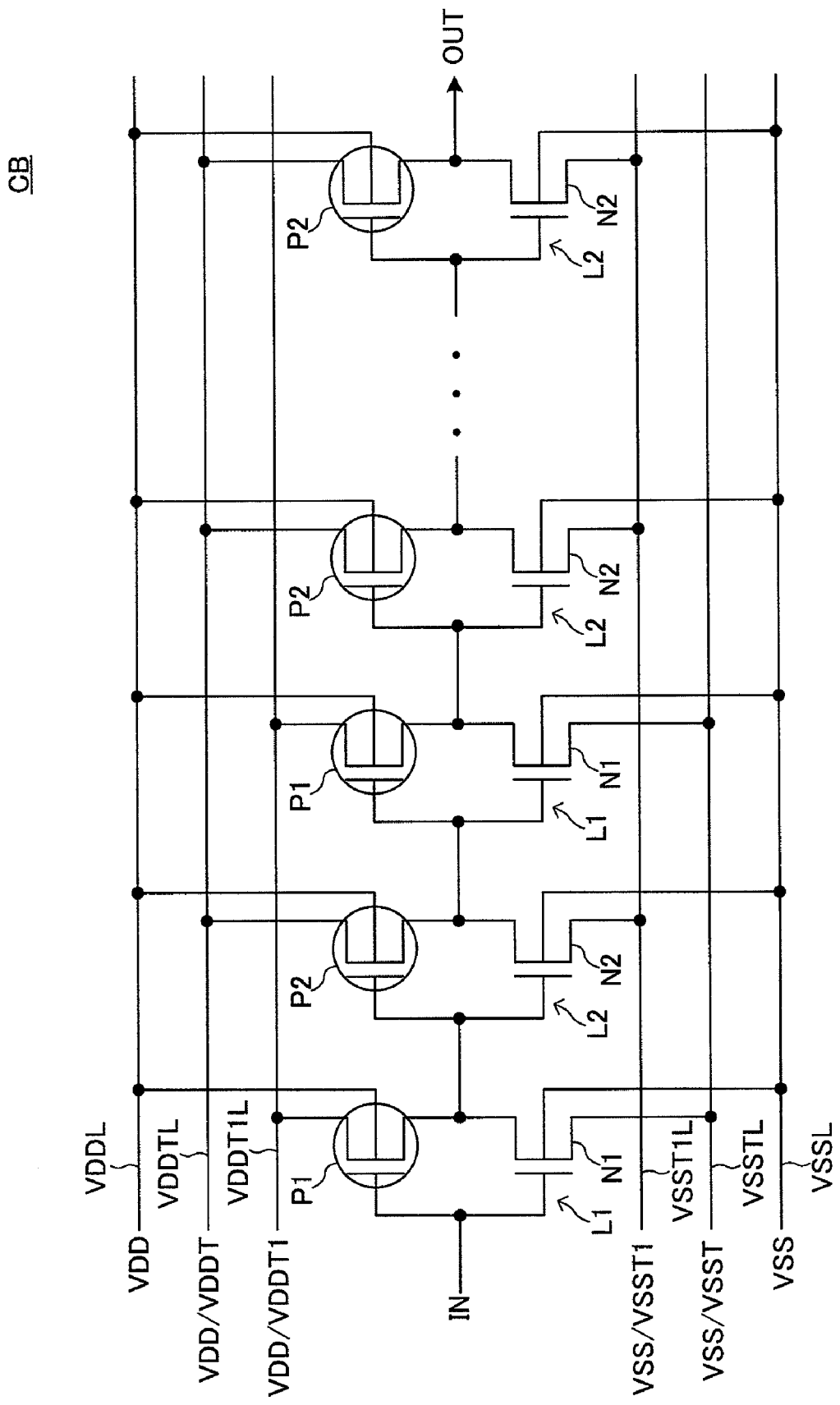
FIG. 4 is a circuit diagram showing a circuit block CB.

FIG. 4 is a circuit diagram of the circuit block CB.

As shown in FIG. 4, the circuit block CB includes a plurality of logic circuits. In the example of FIG. 4, the circuit block CB is shown as an inverter chain; however, the circuit configuration is not limited thereto. Other circuit configurations such as that of a NAND and NOR can be also used.

The logic circuits constituting the circuit block CB, as shown in FIG. 4, include first logic circuits L1 whose power nodes on a high side are connected to the dummy power line VDDT1L and power nodes on a low side are connected to the dummy power line VSSTL, and second logic circuits L2 whose power nodes on the high side are connected to the dummy power line VDDTL and power nodes on the low side are connected to the dummy power line VSST1L. Meanwhile, the high side here means a high potential side and the low side means a low potential side.

In the example shown in FIG. 4, the logic circuit L1 includes a P-channel MOS transistor P1 and an N-channel MOS transistor N1 series connected between the dummy power lines VDDT1L and VSSTL. In the logic circuit L1, a source of the transistor P1 represents the power node on the high side and a source of the transistor N1 represents the power node on the low side. Drains of the transistors P1 and N1 constitute an output node of the logic circuit L1. Similarly, the logic circuit L2 includes a P-channel MOS transistor P2 and an N-channel MOS transistor N2 series connected between the dummy power lines VDDTL and VSST1L. In the logic circuit L2, a source of the transistor P2 represents the power node on the high side and a source of the transistor N2 represents the power node on the low side. Drains of the transistors P2 and N2 constitute an output node of the logic circuit L2.

In the present embodiment, at the time of standby, an input signal of the logic circuit L1 is fixed to a low level and an input signal of the logic circuit L2 is fixed to a high level. In other words, at the time of standby, an output signal of the logic circuit L1 is fixed to a high level and an output signal of the logic circuit L2 is fixed to a low level. Therefore, at the time of standby, the transistors P1 and N2 certainly become electrically conductive and the transistors P2 and N1 certainly become electrically non-conductive. However, because the power potentials VDDT1 and VSST1 are supplied to the transistors P1 and N2 that become electrically conductive at the time of standby, a logic state of the circuit block CB is maintained correctly.

On the other hand, the power potential VDDT supplied to the source of the transistor P2 that becomes electrically non-conductive at the time of standby is lower than the power potential VDDT1, and the power potential VSST supplied to the source of the transistor N1 that becomes electrically non-conductive at the time of standby is higher than the power potential VSST1. Consequently, the subthreshold leak flowing in these transistors P2 and N1 is reduced.

Specifically, although a voltage between a source and a drain of a transistor that becomes electrically non-conductive at the time of being active becomes VDD-VSS, a voltage between the source and the drain of the transistor P2 at the time of standby is reduced to VDDT-VSST1 and a voltage between the source and the drain of the transistor N1 at the time of standby is reduced to VDDT1-VSST. Even when an electric potential of the dummy power line VDDT1L at the time of standby is not changed from VDD and an electric potential of the dummy power line VSST1L at the time of standby is not changed from VSS, although the voltage between the source and the drain of the transistor P2 at the time of standby is reduced to VDDT-VSS and the voltage between the source and the drain of the transistor N1 at the time of standby is reduced to VDD-VSST, in the present embodiment, because the voltages between the sources and the drains are further reduced, the subthreshold leak at the time of standby is further reduced.

Furthermore, as shown in FIG. 4, substrates (back gates) of the transistors P1 and P2 are connected to the main power line VDDL. Consequently, the power potential VDD is always supplied to the transistors P1 and P2 as substrate potentials irrespective of whether in the active mode or the standby mode. Similarly, substrates (back gates) of the transistors N1 and N2 are connected to the main power line VSSL. Consequently, the power potential VSS is always supplied to the transistors N1 and N2 as substrate potentials irrespective of whether in the active mode or the standby mode.

In the present embodiment, because a gate potential of the transistor P1 that becomes electrically conductive at the time of standby is the power potential VSST1, a voltage between the gate of the transistor 21 and the substrate becomes VDD-VSST1. Similarly, because a gate potential of the transistor N2 that becomes electrically conductive at the time of standby is the power potential VDDT1 (<VDD), a voltage between the gate of the transistor N1 and the substrate becomes VDDT1-VSS. When the electric potential of the dummy power line VDDT1L at the time of standby is not changed from VDD and the electric potential of the dummy power line VSST1L at the time of standby is not changed from VSS, either of the voltage between the gate of the transistor P1 and the substrate and the voltage between the gate of the transistor N2 and the substrate becomes VDD-VSS. However, in the present embodiment, because the electric potential of the dummy power line VDDT1L at the time of standby drops to the power potential VDDT1, and the electric potential of the dummy power line VSST1L at the time of standby rises to the power potential VSST1, leakage currents flowing between the gate electrodes and the substrates (back gates) of the transistors P1 and N2 at the time of standby can be reduced.

In addition, in the present invention, because a drain potential (an output signal) of the transistor P2 that becomes electrically non-conductive at the time of standby is the power potential VSST1 (>VSS) and a drain potential (output signal) of the transistor N1 is the power potential VDDT1 (<VDD), leakage currents flowing between the drains and the substrates (back gates) of the transistors P2 and N1 at the time of standby can even be reduced.

Figure 5A:
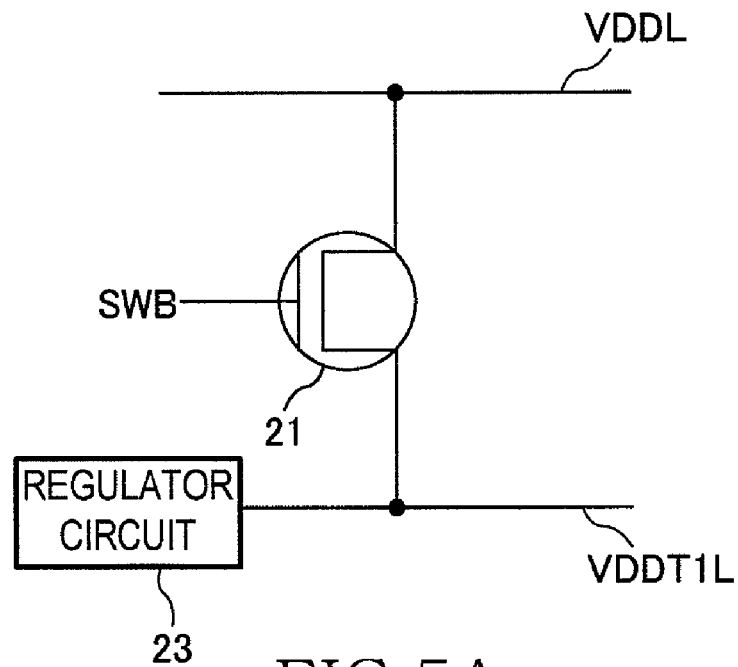
FIG. 5A is a circuit diagram of the off-leakage control circuit 20 of another example.
Figure 5B:
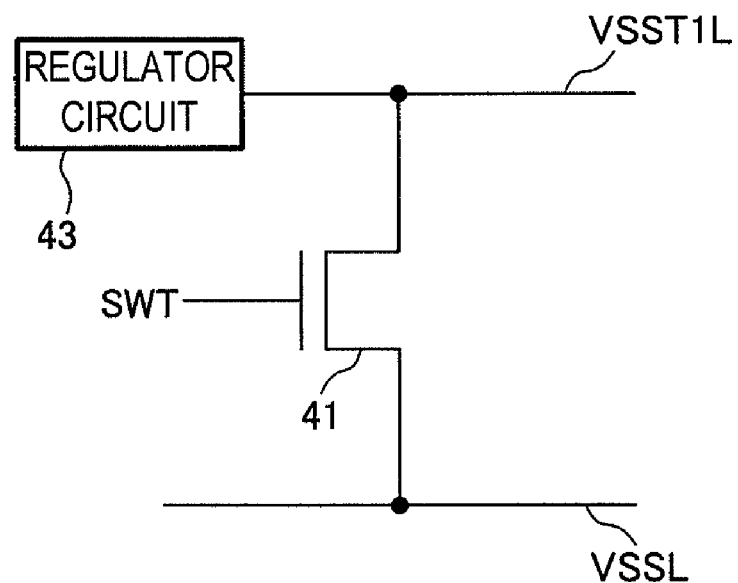
FIG. 5B is a circuit diagram of the off-leakage control circuit 40 of another example.

FIG. 5A is a circuit diagram of the off-leakage control circuit 20 of another example, and FIG. 5B is a circuit diagram of the off-leakage control circuit 40 of another example.

The off-leakage control circuit 20 of FIG. 5A includes the P-channel MOS transistor 21 that is connected between the main power line VDDL and the dummy power line VDDT1L, and a regulator circuit 23 that is connected to the dummy power line VDDT1L. It differs from the off-leakage control circuit 20 of FIG. 2A in that it does not include the diode 22.

Figure 6A:
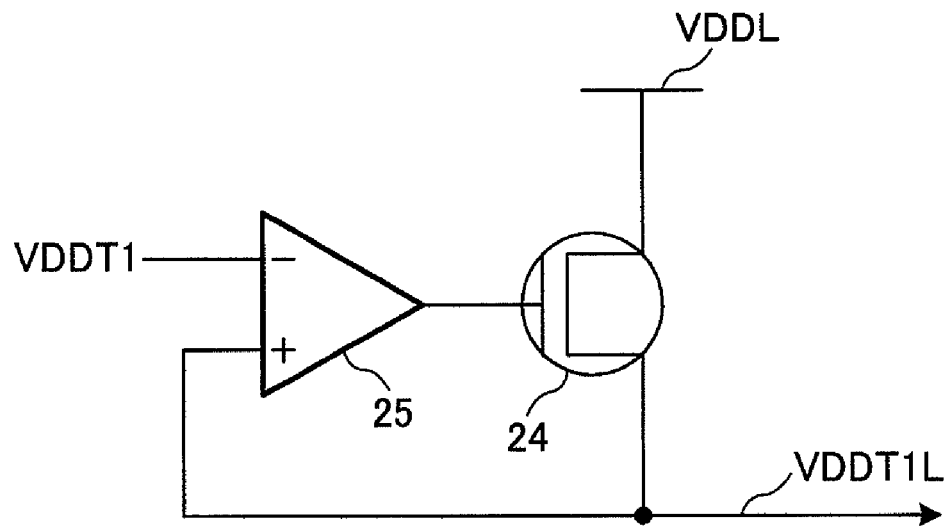
FIG. 6A is a circuit diagram of a regulator circuit 23.

FIG. 6A is a circuit diagram of the regulator circuit 23. As shown in FIG. 6A, the regulator circuit 23 includes a P-channel MOS transistor 24 that is connected between the main power line VDDL and the dummy power line VDDT1L, and an operational amplifier 25 whose output terminal is connected to a gate electrode of the transistor 24. The power potential VDDT1 is supplied to an inverting input terminal (−) of the operational amplifier 25, and a non-inverting input terminal (+) is connected to the dummy power line VDDT1L. Therefore, when the power potential VDDT1 is input into the inverting input terminal (−) of the operational amplifier 25 when the transistor 21 is turned off, the power potential VDDT1 appears in the dummy power line VDDT1L. The power potential VDDT1 supplied to the inverting input terminal (−) is an electric potential that determines the electric potential of the dummy power line VDDT1L, and is set to a predetermined electric potential so as to minimize various types of the leakage current. The inverting input terminal is an input node of the regulator circuit 23, and exerts control over the electric potential of the dummy power line VDDT1L according to the predetermined electric potential that the inverting input terminal itself receives.

The off-leakage control circuit 40 of FIG. 5B includes the N-channel MOS transistor 41 that is connected between the dummy power line VSST1L and the main power line VSSL, and a regulator circuit 43 connected to the dummy power line VSST1L. It differs from the off-leakage control circuit 40 of FIG. 2D in that it does not include the diode 42.

Figure 6B:
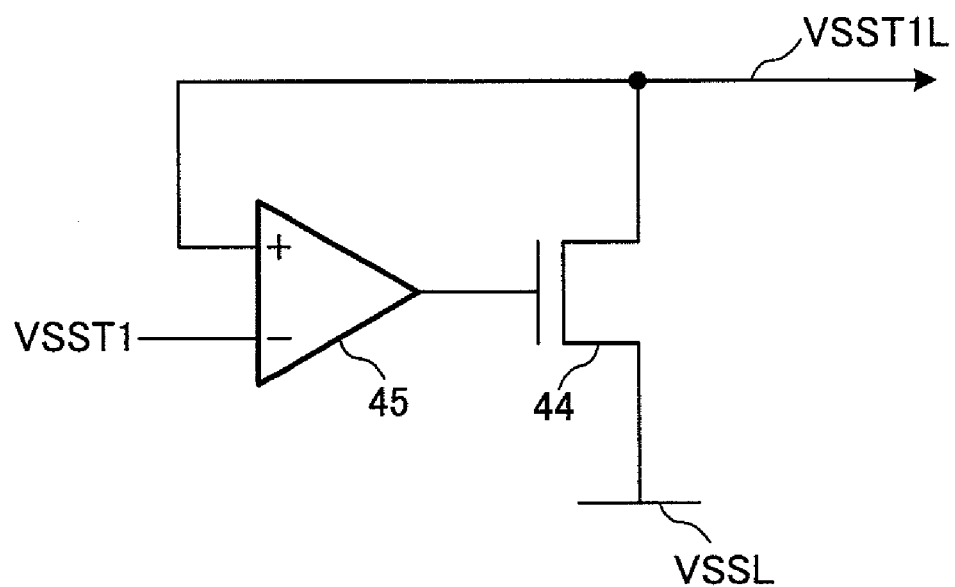
FIG. 6B is a circuit diagram of a regulator circuit 43.

FIG. 6B is a circuit diagram of the regulator circuit 43. As shown in FIG. 6B, the regulator circuit 43 includes an N-channel MOS transistor 44 that is connected between the dummy power line VSST1L and the main power line VSSL, and an operational amplifier 45 whose output terminal is connected to a gate electrode of the transistor 44. The power potential VSST1 is supplied to an inverting input terminal (−) of the operational amplifier 45, and a non-inverting input terminal (+) is connected to the dummy power line VSST1L. Therefore, when the power potential VSST1 is input into the inverting input terminal (−) of the operational amplifier 45 when the transistor 41 is turned off, the power potential VSST1 appears in the dummy power line VSST1L. The power potential VSST1 supplied to the inverting input terminal (−) is an electric potential that determines the electric potential of the dummy power line VSST1L, and is set to a predetermined electric potential so as to minimize various types of the leakage current. The inverting input terminal is an input node of the regulator circuit 43, and exerts control over the electric potential of the dummy power line VSST1L according to the predetermined electric potential that the inverting input terminal itself receives.

As described above, in the off-leakage control circuits 20 and 40 of FIGS. 5A and 5B, the electric potential levels of the dummy power lines VDDT1L and VSST1L at the time of standby can be minutely adjusted by the regulator circuits 23 and 43. As a result, reduction of the subthreshold current can be optimized. Furthermore, the levels of the power potentials VDDT1 and VSST1 can be dynamically altered depending on temperature conditions, processing conditions, manufacturing variation and the like.

Figure 7A:
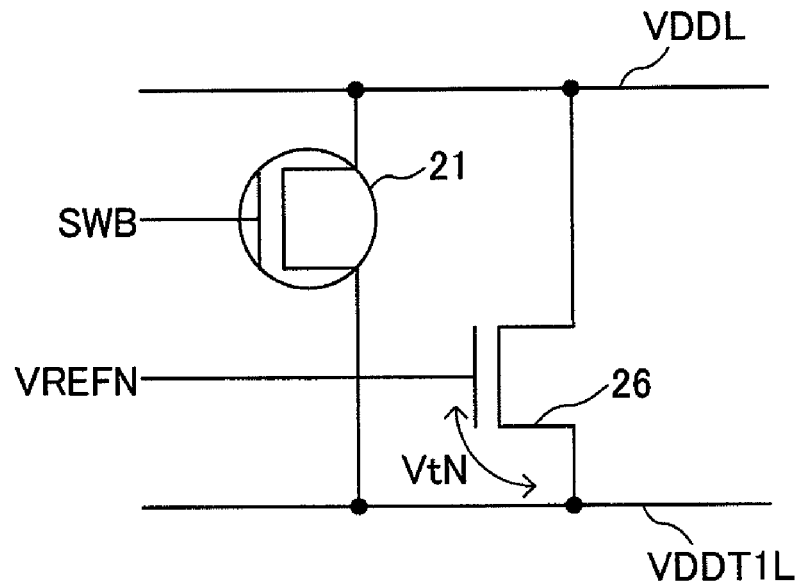
FIG. 7A is a circuit diagram of the off-leakage control circuit 20 of still another example.
Figure 7B:
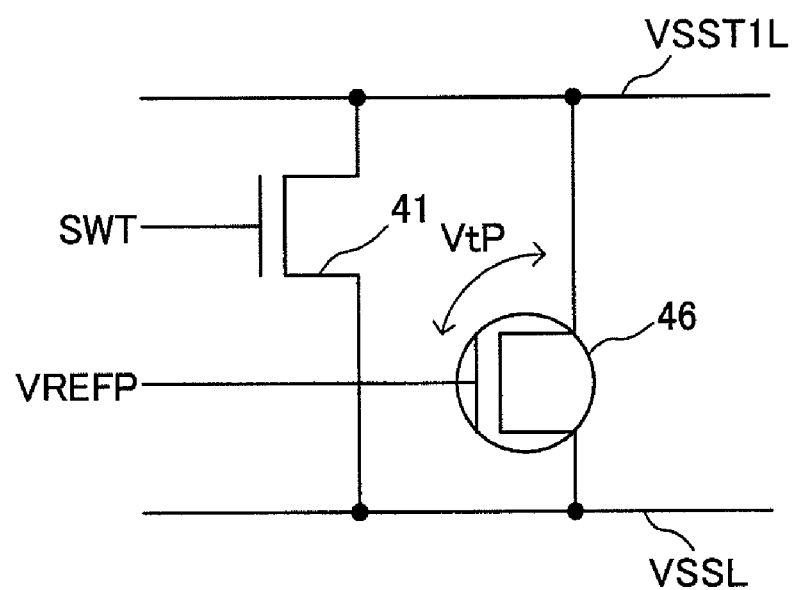
FIG. 7B is a circuit diagram of the off-leakage control circuit 40 of still another example.

FIG. 7A is a circuit diagram of the off-leakage control circuit 20 of still another example, and FIG. 7B is a circuit diagram of the off-leakage control circuit 40 of still another example.

The off-leakage control circuit 30 of FIG. 7A includes the P-channel MOS transistor 21 and an N-channel MOS transistor 26 (transistor switch) that are parallel connected between the main power line VDDL and the dummy power line VDDT1L. A reference potential VREFN is supplied to a gate electrode of the transistor 26. Therefore, when the transistor 21 is turned off, that is, in the standby mode, assuming that a threshold voltage of the transistor 26 is VtN, an electric potential equivalent to VREFN−VtN appears in the dummy power line VDDT1L. The electric potential supplied to the dummy power line VDDT1L can be adjusted by adjusting the reference potential VREFN.

Similarly, the off-leakage control circuit 40 of FIG. 7B includes the N-channel MOS transistor 41 and a P-channel MOS transistor 46 (transistor switch) that are parallel connected between the dummy power line VSST1L and the main power line VSSL. A reference potential VREFP is supplied to a gate electrode of the transistor 46. Due to this, even when the transistor 41 is turned off, that is, in the standby mode, assuming that a threshold voltage of the transistor 46 is VtP, an electric potential equivalent to VREFP+VtP appears in the dummy power line VSST1L. The electric potential supplied to the dummy power line VSST1L can be adjusted by adjusting the reference potential VREFP.

Thus, in the off-leakage control circuits 20 and 40 of FIGS. 7A and 7B also, the electric potential levels of the dummy power lines VDDT1L and VSST1L at the time of standby can be minutely adjusted by the N-channel MOS transistor 26 and the P-channel MOS transistor 46. As a result, reduction of the subthreshold current can be optimized. Furthermore, the levels of the power potentials VDDT1 and VSST1 can be dynamically altered depending on temperature conditions or the like.

Figure 8:
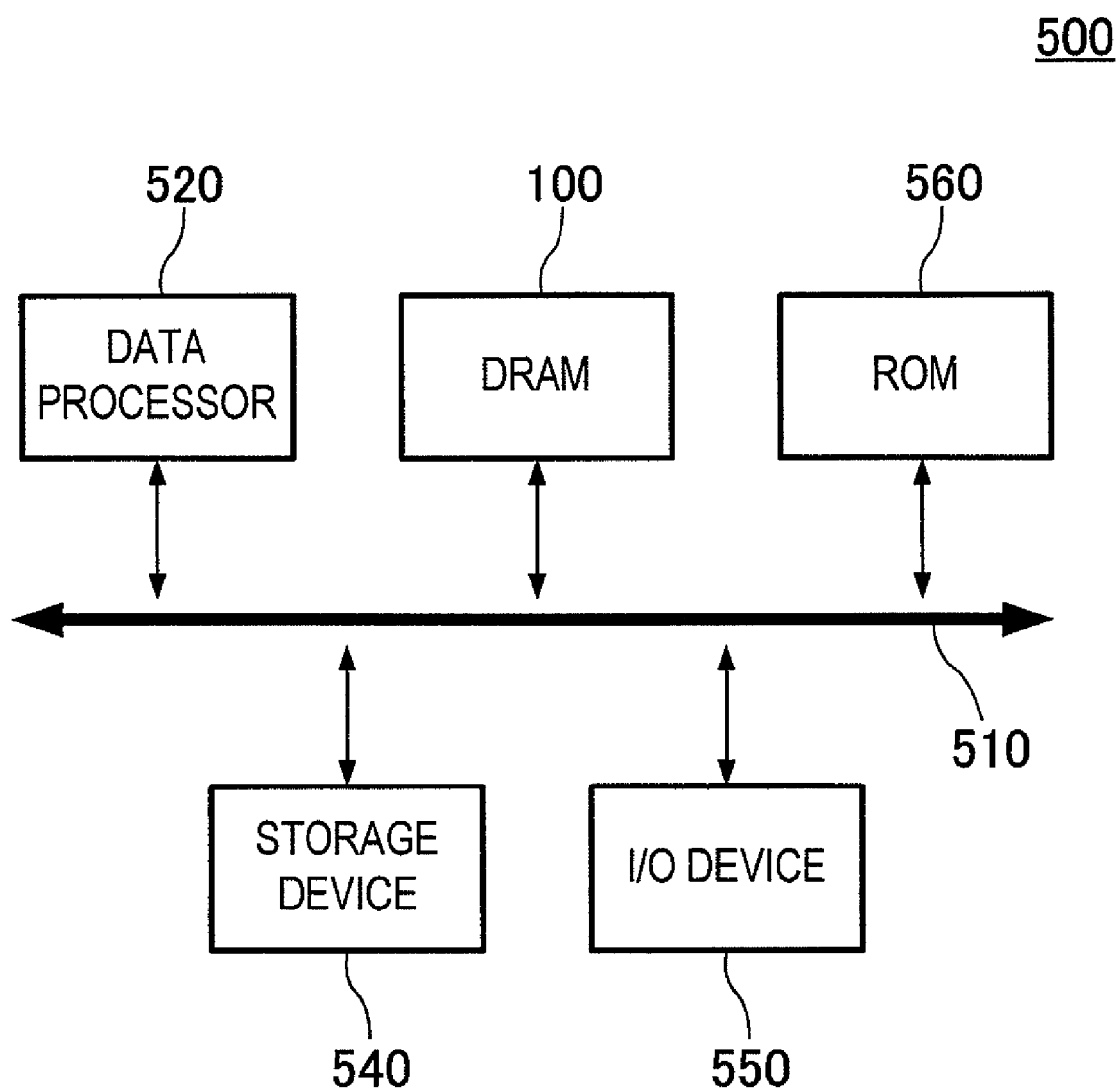
FIG. 8 is a block diagram showing a configuration of a data processing system 500 using the semiconductor device 100 according to the embodiment of the present invention.

FIG. 8 is a block diagram showing the configuration of a data processing system 500 using the semiconductor device 100 according to this embodiment.

The data processing system 500 shown in FIG. 8 has a configuration in which a data processor 520 and the semiconductor device (DRAM) 100 according to this embodiment are mutually connected via a system bus 510. The data processor 520, for example, includes micro-processor (MPU) or digital signal processor (DSP). But it is not limited to them. In FIG. 8, for the sake of shorthand, the data processor 520 and the DRAM 100 are connected via the system bus 510. But they may be connected using a local bus not via the system bus 510.

In FIG. 8, for the sake of shorthand, only one set of the system bus 510 is drawn. But a plurality of system buses 510 may be provided in serial or parallel manner via some connectors etc., if needed. In the data processing system 500 shown in FIG. 8, a storage device 540, I/O device 550, and ROM 560 are also connected to the system bus 510. But these components are not indispensable.

The storage device 540 may be a hard disk drive, an optical disk drive, or a flash memory. The I/O device 550 may be one or more display devices such as a liquid display, but not limited to, or one or more input devices such as a keyboard, a mouse, but not limited to. The I/O device 550 can be only one of the input device and the output device.

Though only one component is drawn for each of the components shown in FIG. 8, the number of each of the components is not limited to one. The data processing system 500 can include a plurality of each of the components.

In the embodiment of the present invention, a controller (for example, the data processor 520), which controls a DRAM, issues various commands to the DRAM 100. The DRAM 100 switches to the active mode or the standby mode based on these commands. The plurality of commands issued by the controller are commands (system commands), which are defined by a known trade organization (JEDEC (Joint Electron Device Engineering Council) Solid State Technology Association) controlling semiconductor devices.

It is apparent that the present invention is not limited to the above embodiments, but may be modified and changed without departing from the scope and spirit of the invention.

The basic technical concept of the present application can be applied to, for example, transmission route of control signals of the critical path that determine external access, data signals of a memory or a data processor and the like. Furthermore, the circuit configurations of the circuit blocks, the logic circuits, the off-leakage control circuits, switch circuits, and other circuits that generate control signals are not limited to those disclosed in the embodiment described above.

Generally, the active mode (first state) indicates a period when the semiconductor device 100 is accessed from outside. Conversely, the standby mode (second state) indicates when the semiconductor device 100 is not accessed from outside even though power is supplied to the semiconductor device 100 from outside. The semiconductor device 100 may be provided with a refresh function that is executed at predetermined time intervals to retain information stored in volatile memory cells such as a DRAM (Dynamic Random Access Memory). The semiconductor device 100 may be further provided with a self refresh function by which the refresh operation is performed asynchronously with the outside by an internal timer provided inside the semiconductor device 100. When the self refresh function is active, a system in which the semiconductor device 100 is installed is in the standby mode; however, due to the self refresh operation performed intermittently by the timer inside the semiconductor device 100, the semiconductor device 100 repeatedly switches between the standby mode (defined as a standby 1 mode) and the active mode (the refresh operation). In the present application, the standby 1 mode during the self refresh operation is also included in the second state.

The basic technical concept of the present invention can be applied to various semiconductor devices. That is, the present invention can be applied to general semiconductor devices, such as a CPU (Central Processing Unit), an MCU (Micro Control Unit), a DSP (Digital Signal Processor), an ASIC (Application Specific Integrated Circuit), an ASSP (Application Specific Standard Circuit), or a memory. As shown in FIG. 10, the present invention can be applied to the data processor 520, the storage device 540, and the ROM 560. The production mode of semiconductor devices to which the present invention is applied includes an SOC (System on Chip), an MCP (Multi Chip Package), and a POP (Package on Package). The present invention can be applied to semiconductor devices having such a production mode or a packaging mode.

When an FET (Field Effect Transistor) is used as the transistor in the present invention, various types of FETs such as MIS (Metal-Insulator Semiconductor) and TFT (Thin Film Transistor) can be used as well as MOS (Metal Oxide Semiconductor). As the transistor, other than FETS, various types of transistors such as a bipolar transistor can be also used. A bipolar transistor can be included in a part of the device.

In addition, a PMOS transistor (P-channel MOS transistor) is a representative example of a first conductive transistor, and an NMOS transistor (N-channel MOS transistor) is a representative example of a second conductive transistor.

Many combinations and selections of various constituent elements disclosed in this specification can be made within the scope of the appended claims of the present invention. That is, it is needless to mention that the present invention embraces the entire disclosure of this specification including the claims, as well as various changes and modifications which can be made by those skilled in the art based on the technical concept of the invention.

What is claimed is:

1. A semiconductor device comprising:
   first and fourth power lines that are not power gated;
   second, third, fifth and sixth power lines that are power gated;
   a first logic circuit having an input node to receive an input signal and an output node to output an output signal, one power node on a high potential side and other power node on a low potential side, the one power node of the first logic circuit being connected to the third power line, and the other power node of the first logic circuit being connected to the fifth power line;
   a second logic circuit having an input node to receive an input signal and an output node to output an output signal, one power node on a high potential side and other power node on a low potential side, the one power node of the second logic circuit being connected to the second power line, and the other power node of the second logic circuit being connected to the sixth power line; and a control circuit that performs power gating control over the second, third, fifth and sixth power lines, respectively, wherein the control circuit controls, in a first state, an electric potential of the second and third power lines to a first potential of the first power line and controls an electric potential of the fifth and sixth power lines to a second potential of the fourth power line, the control circuit further controls, in a second state, an electric potential of the third power line to a third potential lower than the first potential, an electric potential of the second power line to a fourth potential lower than the third potential, an electric potential of the sixth power line to a fifth potential higher than the second potential, and an electric potential of the fifth power line to a sixth potential higher than the fifth potential, the first logic circuit outputs a signal having the third potential from the output node thereof in the second state, and the second logic circuit outputs a signal having the fifth potential from the output node thereof in the second state.

2. The semiconductor device as claimed in claim 1, wherein the output node of the first logic circuit is connected to the input node of the second logic circuit.

3. The semiconductor device as claimed in claim 1, wherein the control circuit includes first to fourth off-leakage control circuits, the first off-leakage control circuit is coupled between the first power line and the second power line, the second off-leakage control circuit is coupled between the first power line and the third power line, the third off-leakage control circuit is coupled between the fourth power line and the fifth power line, the fourth off-leakage control circuit is coupled between the fourth power line and the sixth power line, the first off-leakage control circuit electrically disconnects the second power line from the first power line in the second state, and the third off-leakage control circuit electrically disconnects the fifth power line from the fourth power line in the second state.

4. The semiconductor device as claimed in claim 1, wherein each of the first and second logic circuits includes a first transistor of a first conductivity type connected between the one power node and the output node, and a second transistor of a second conductivity type connected between the other power node and the output node, and back gates of the first transistors are connected to the first power line and back gates of the second transistors are connected to the fourth power line.

5. A data processing system comprising:

the semiconductor device as claimed in claim 1; and a controller that supplies a command to the semiconductor device, wherein the semiconductor device enters in the first state or the second state based on the command.

6. A semiconductor device comprising:

first to third power lines respectively supplied with an electric potentials showing a first logical level;

a fourth power line supplied with an electric potential showing a second logical level;

a first off-leakage control circuit that supplies the second power line with an electric potential that is same as the first potential of the first power line by electrically connecting the second power line to the first power line in a first state, and electrically disconnects the second power line from the first power line in a second state;

a second off-leakage control circuit that supplies the third power line with an electric potential that is same as the first potential in the first state, and supplies the third power line with a third potential shifted from the first potential toward a second potential lower than the first potential of the fourth power line in the second state; and a circuit block including a plurality of logic circuits each having an output node, wherein the circuit block includes first logic circuits which a signal output from the output node thereof in the second state is fixed to the first logical level, each of the first logic circuits includes one power node connected to the third power line and other power node supplied with the second potential at least in the first state, and the circuit block includes second logic circuits which a signal output from the output node thereof in the second state is fixed to the second logical level, each of the second logic circuits includes one power node connected to the second power line and other power node supplied with the second potential at least in the first state.

7. The semiconductor device as claimed in claim 6, wherein an electric potential of the second power line in the second state shifts to the second potential from the third potential and becomes a fourth potential higher than the second potential.

8. The semiconductor device as claimed in claim 6, wherein the other power node of the second logic circuit is supplied with the second potential in the first state and supplied with a fifth potential shifted toward the first potential from the second potential in the second state.

9. The semiconductor device as claimed in claim 8, wherein the other power node of the first logic circuit is supplied with the second potential in the first state and supplied with a sixth potential shifted toward the first potential from the fifth potential in the second state.

10. The semiconductor device as claimed in claim 9, further comprising:

fifth and sixth power lines respectively supplied with an electric potentials showing the second logical level;

a third off-leakage control circuit that supplies the fifth power line with an electric potential that is same as that of the second potential by electrically connecting the fifth power line to the fourth power line in the first state, and electrically disconnects the fifth power line from the fourth power line in the second state; and a fourth off-leakage control circuit that supplies the sixth power line with an electric potential that is same as the second potential in the first state, and supplies the sixth power line with the fifth potential in the second state, wherein an electric potential of the fifth power line in the second state becomes the sixth potential, and the other power node of the first logic circuit is connected to the fifth power line and the other power node of the second logic circuit is connected to the sixth power line.

11. The semiconductor device as claimed in claim 6, wherein the first state is a state where the output signals of the first and second logic circuits are changeable.

12. The semiconductor device as claimed in claim 6, wherein the first off-leakage control circuit includes a first switch circuit connected between the first and second power lines, the second off-leakage control circuit includes a second switch circuit connected between the first and third power lines, the first and second switch circuits are in an electrical conductive state in the first state, and the first and second switch circuits are in an electrical non-conductive state in the second state.

13. The semiconductor device as claimed in claim 12, wherein the first and second switch circuits comprise electric field effect transistors of a first conductivity type whose sources are connected to the first power line and drains are connected to the second power line and the third power line, respectively.

14. The semiconductor device as claimed in claim 12, wherein the second off-leakage control circuit further includes a step-down circuit connected between the first and third power lines.

15. The semiconductor device as claimed in claim 14, wherein the step-down circuit comprises a diode whose anode is connected to the first power line and cathode is connected to the third power line.

16. The semiconductor device as claimed in claim 12, wherein the second off-leakage control circuit further includes a regulator circuit that supplies the third power line with the third potential in the second state, and the regulator circuit controls the third potential based on a predetermined electric potential applied to an input node thereof.

17. The semiconductor device as claimed in claim 12, wherein the second off-leakage control circuit further includes a transistor switch whose source is connected to the third power line, drain is connected to the first power line, and to whose gate is supplied a control potential, and the transistor switch controls the third potential based on the control potential.

18. The semiconductor device as claimed in claim 17, wherein conductivity types of an electric field effect transistor constituting the second switch circuit and an electric field effect transistor constituting the transistor switch are mutually opposite.

19. A data processing system comprising:

the semiconductor device as claimed in claim 6; and a controller that supplies a command to the semiconductor device, wherein the semiconductor device enters in the first state or the second state based on the command.

20. A semiconductor device comprising:

a first logic circuit having a first output node and including a first transistor of a first conductivity type that becomes electrically conductive when an output signal to be output from the first output node to a high level and a second transistor of a second conductivity type that becomes electrically conductive when the output signal to be output from the first output node to a low level; and a second logic circuit having a second output node and including a third transistor of the first conductivity type that becomes electrically conductive when an output signal to be output from the second output node to a high level and a fourth transistor of the second conductivity type that becomes electrically conductive when the output signal to be output from the second output node to a low level, wherein in a first state an electric potential of drains of the first to fourth transistors that is in an electrical conductive state becomes a first potential when an output signal of a corresponding logic circuit is at a high level and becomes a second potential when an output signal of a corresponding logic circuit is at a low level, in a second state an electric potential of a drain of the first transistor becomes a third potential shifted from the first potential toward the second potential, a voltage between a source and a drain of the second transistor becomes smaller than a difference potential between the third potential and the second potential, an electric potential of a drain of the fourth transistor becomes a fifth potential shifted from the second potential toward the first potential, a voltage between a source and a drain of the third transistor becomes smaller than a difference potential between the first potential and the fifth potential, and absolute potentials are higher in order of the first potential, the third potential, the fifth potential, and the second potential.

21. The semiconductor device as claimed in claim 20, wherein in the second state an electric potential of a source of the second transistor becomes a sixth potential shifted from the fifth potential toward the first potential, an electric potential of a source of the third transistor becomes a fourth potential shifted from the third potential toward the second potential, and absolute potentials are higher in order of the first potential, the third potential, the fourth potential, the sixth potential, the fifth potential, and the second potential.

22. A data processing system comprising:

the semiconductor device as claimed in claim 20; and a controller that supplies a command to the semiconductor device, wherein the semiconductor device enters in the first state or the second state based on the command.

* * * * *